United States Patent
Fujikawa et al.

(10) Patent No.: US 7,157,735 B2
(45) Date of Patent: Jan. 2, 2007

(54) ACTIVE MATRIX SUBSTRATE WITH TFT AND CAPACITOR, AND LCD USING THE SAME

(75) Inventors: Tetsuya Fujikawa, Kawasaki (JP); Seiji Doi, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/321,167

(22) Filed: Dec. 17, 2002

(65) Prior Publication Data

US 2003/0116764 A1 Jun. 26, 2003

(30) Foreign Application Priority Data

Dec. 20, 2001 (JP) ............... 2001-387961

(51) Int. Cl.
- *H01L 29/04* (2006.01)
- *H01L 31/036* (2006.01)
- *H01L 31/0376* (2006.01)
- *H01L 31/20* (2006.01)

(52) U.S. Cl. ............... 257/59; 257/71; 257/72

(58) Field of Classification Search ........ 438/158, 438/163; 257/59, 758–768, 71, 72
See application file for complete search history.

(56) References Cited

U.S. PATENT DOCUMENTS

| | | | |
|---|---|---|---|
| 5,428,250 A * | 6/1995 | Ikeda et al. ............... | 349/147 |
| 5,483,082 A | 1/1996 | Takizawa et al. | |
| 5,580,796 A | 12/1996 | Takizawa et al. | |
| 5,677,211 A * | 10/1997 | Kaneko ............... | 438/158 |
| 2002/0171083 A1 * | 11/2002 | Lim et al. ............... | 257/59 |
| 2003/0035078 A1 * | 2/2003 | Maruyama et al. ......... | 349/117 |

FOREIGN PATENT DOCUMENTS

| | | |
|---|---|---|
| JP | 61-065477 | 4/1986 |
| JP | 64-052130 | 2/1989 |
| JP | 6-202153 | 7/1994 |
| JP | 06-208137 | 7/1994 |
| JP | 06-337436 | 12/1994 |
| JP | 06-347825 | 12/1994 |
| JP | 08-160457 | 6/1996 |

* cited by examiner

*Primary Examiner*—Mary Wilczewski
*Assistant Examiner*—Monica Lewis
(74) *Attorney, Agent, or Firm*—Greer, Burns & Crain, Ltd

(57) ABSTRACT

A thin-film transistor substrate, including a substrate with an insulating surface, gate electrodes, lower electrodes of capacitors made of the same material layer as the gate electrodes, a first insulating layer, a channel layer of high resistivity semiconductor having a concave part, and a pair of low resistivity source/drain electrodes. There is also a second insulating layer formed on the first insulating layer. A first connection hole penetrates the second insulating layer and exposes one of each of the pair of the source/drain electrodes. A second connection hole penetrates the second insulating layer and exposes a connection region of each of the upper layers of the upper electrode above the lower layer. A pixel electrode is formed on the second insulating layer and is connected to one of the source/drain electrodes and the upper layer of the upper electrode of the capacitor via the first and second connection holes.

8 Claims, 5 Drawing Sheets

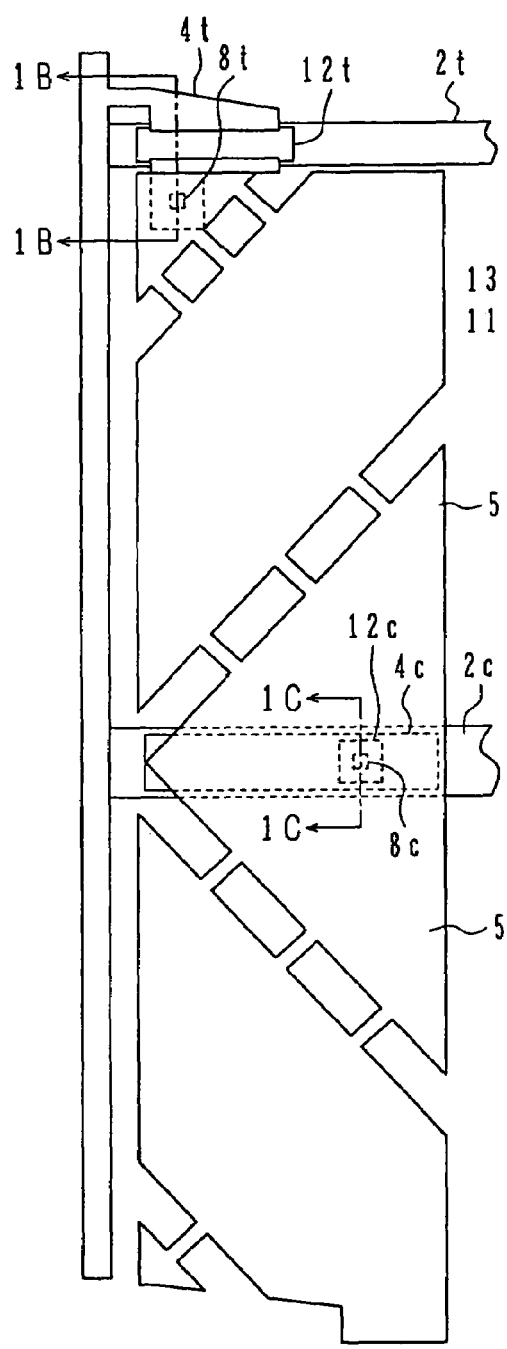
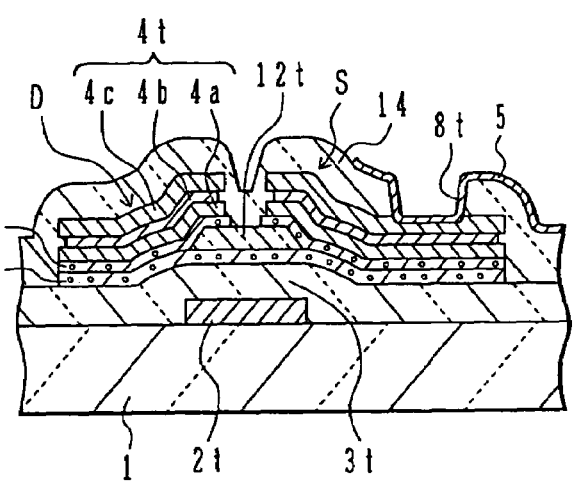
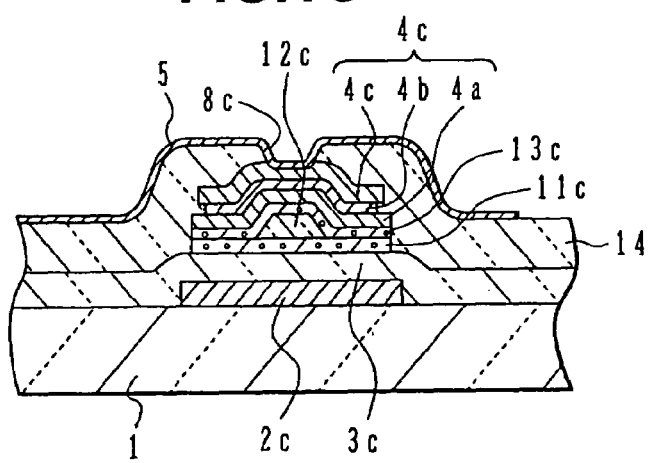
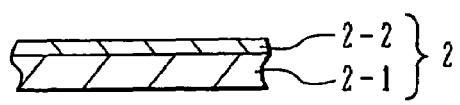

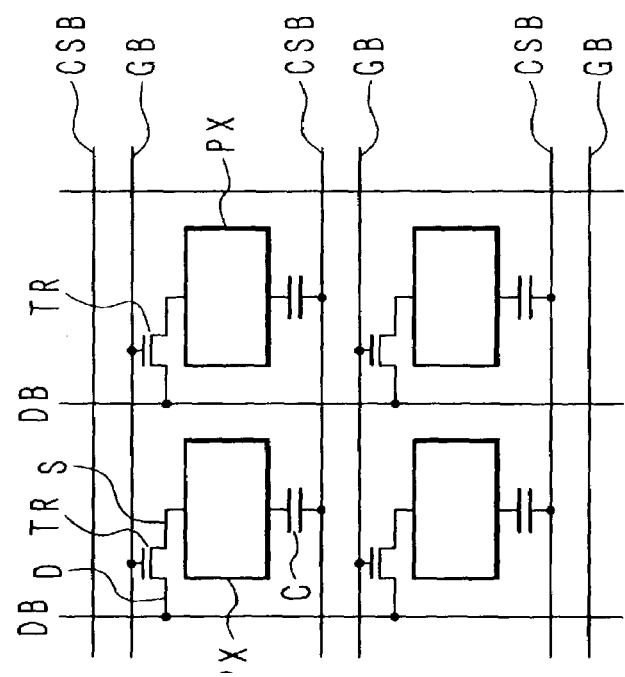
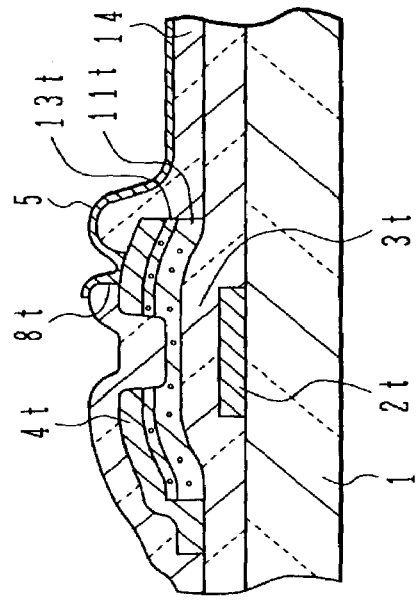
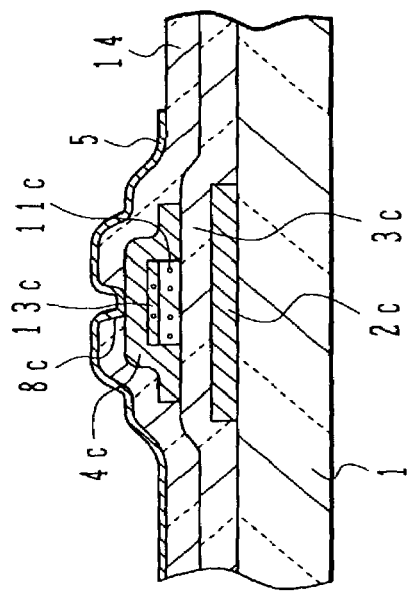
FIG.2A
FIG.2B
FIG.2C

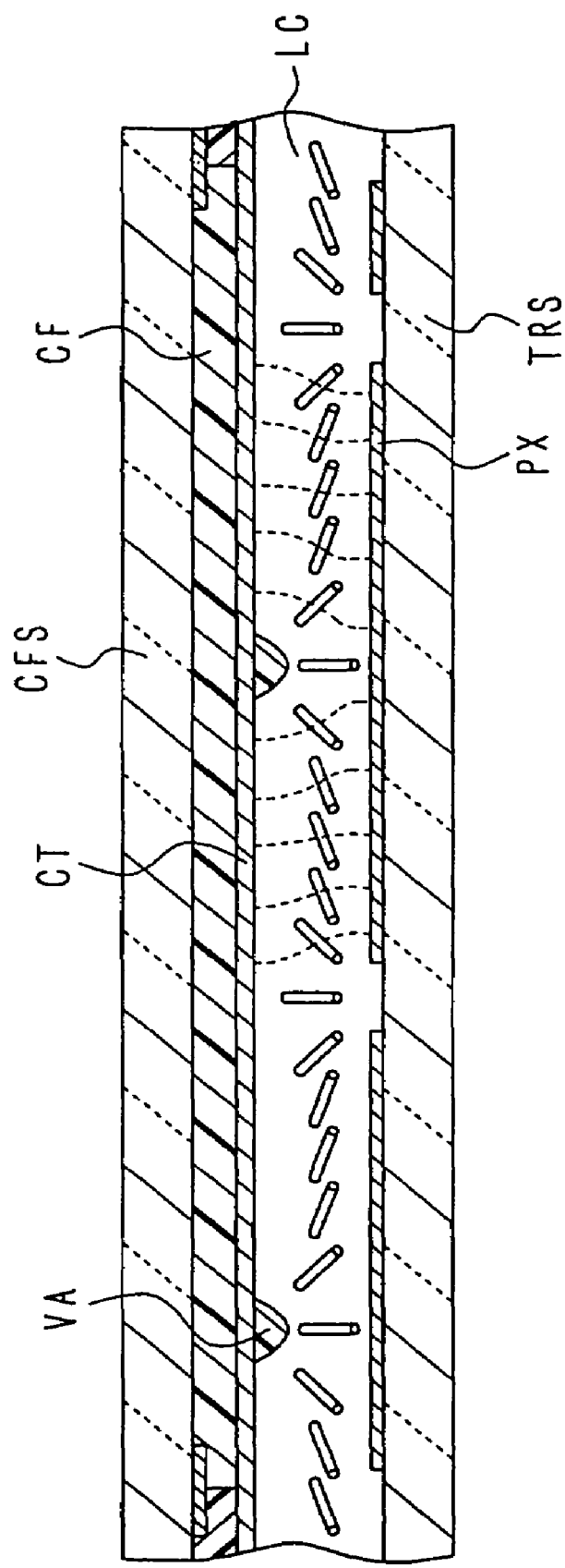

ACTIVE MATRIX SUBSTRATE WITH TFT AND CAPACITOR, AND LCD USING THE SAME

CROSS REFERENCE TO RELATED APPLICATION

This application is based on Japanese Patent Application 2001-387961, filed on Dec. 20, 2001, the entire contents of which are incorporated herein by reference.

BACKGROUND OF THE INVENTION

A) Field of the Invention

This invention relates to a thin film transistor (TFT) substrate and a liquid crystal display and especially to those having additional or subsidiary storage capacitors.

B) Description of the Related Art

Recently, a liquid crystal display is widely used for an information device, etc., and lower cost and higher resolution are sought. Most of thin film transistor substrates have additional or subsidiary storage capacitors for storing information for pixel electrodes at respective pixels. The additional storage capacitor is generally formed with an opaque body, and therefore causes a reduction in an effective pixel area. Miniaturization of the additional storage capacitor that occupies a comparatively large region is demanded. Also, in a manufacturing process of the additional storage capacitor, interlayer short-circuit etc. causes defections. Decreasing the defections is expected.

FIGS. 5A to 5D show examples of configurations of thin film transistor substrates according to the prior art.

FIG. 5A is a plan view showing a thin film transistor substrate by the conventional technology. FIG. 5B is a cross sectional view showing a part of a thin film transistor along the line VB—VB in FIG. 5A, and FIG. 5C is a cross sectional view showing an additional storage capacitor part along the line VC—VC in FIG. 5A.

A gate bus line 2t and an additional storage capacitor bus line 2c are formed by patterning a metallic layer on a substrate 1 having an insulating surface such as a glass substrate or the like. The bus lines 2t and 2c are electrically isolated from each other. An insulating layer 3 such as a silicon nitride or the like is formed on the entire surface of the substrate 1 so as to cover the bus lines 2t and 2c. The insulating layer 3 forms a gate insulating film 3t in the thin film transistor region and a dielectric film of a capacitor 3c in the additional storage capacitor region.

A high resistivity amorphous silicon layer that can form a thin film transistor channel (11t, 11c) is deposited on an insulating layer 3, and thereon a silicon nitride layer having a function of an etching stopper is deposited. The silicon nitride layer is patterned to remain as a channel protection layer 12t only in the thin film transistor channel region. An n$^+$-type amorphous silicon layer that is highly doped with n-type impurity is deposited on the high resistivity amorphous silicon layer so as to cover the channel protection layer 12t. The amorphous silicon layer and the silicon nitride layer are deposited by, for example, chemical vapor deposition (CVD).

A Ti layer 4a, an Al layer 4b and a Ti layer 4c are laminated on an amorphous silicon layer, for example, by sputtering. A resist pattern is formed on the Ti layer 4c, and the Ti layer 4c, the Al layer 4b, the Ti layer 4a, the n$^+$ type amorphous silicon layer and the high resistivity amorphous silicon layer are patterned into, respectively. 13t/13c and 11t/11c. The channel protection layer 12t is formed on the channel region; therefore, the etching on the channel region is stopped at the channel protection layer 12t, and the high resistivity amorphous silicon layer underneath is not etched.

As described above, source/drain electrodes and an upper electrode of the capacitor are formed in the thin film transistor region and the additional storage capacitor region.

Covering the Ti layer 4c, an insulating protection layer 14, for example, of silicon nitride, is deposited on an insulating layer 3 by CVD or the like. Contact apertures 8t and 8c are formed on a source region of the thin film transistor and an upper electrode of a connecting region of the additional storage capacitor. In this etching process, for example, if a pinhole exists on the Ti layer 4c, the Al layer 4b and the Ti layer 4a, the etching reaches the layer underneath.

When a pinhole exists in a metallic lamination at the bottom of a connection hole 8c in FIG. 5C, the etching reaches the amorphous silicon layers 13c, 11c, and the lower insulating layer 3c, and may reach the lower electrode 2c.

Then, an indium-tin oxide (ITO) layer 5 is deposited on the insulating protection layer 14 covering the connection hole, and patterned to form a pixel electrode. If the lower electrode 2c is exposed by a pinhole, a pixel electrode 5 short-circuits the lower and the upper electrodes, and a capacitor loses its function.

FIG. 5D shows an example of a structure having a contact of the upper electrode to the pixel electrode outside the lower electrode to prevent the short circuit. Because the contact of the upper electrode is formed outside the lower electrode, the short circuit can be prevented even if a pinhole exists. However, the lower and the upper electrodes are both opaque layers so that an effective area of the pixel electrode decreases in such degree that the upper electrode extends outside the lower electrode.

In the thin film transistor substrate having an additional storage capacitor, preventing the short circuit between the electrodes of the additional storage capacitor and obtaining a valid pixel area as large as possible were difficult.

SUMMARY OF THE INVENTION

It is an object of the present invention to provide a thin film transistor substrate and a liquid crystal display that can prevent a short circuit between electrodes of an additional storage capacitor and obtain a larger valid pixel region at the same time.

It is another object of the present invention to provide a thin film transistor substrate and a liquid crystal display having a novel structure.

According to one aspect of the present invention, there is provided a thin-film transistor substrate comprising a substrate having an insulating surface, gate electrodes made of a conductive material layer formed on said substrate, lower electrodes of capacitors made of a same material layer as said gate electrode and formed on said substrate, a first insulating layer formed on said substrate and covering said gate electrodes and said lower electrodes of the capacitors, a channel layer of high resistivity semiconductor formed on said first insulating layer over each said gate electrode, a lower layer of each upper electrode of the capacitors made of a same material layer as said channel layer and formed on said first insulating layer above said lower electrodes of the capacitor, a channel protection layer formed on an intermediate part of each said channel layer, a capacitor protection layer made of a same material layer as said channel protection layer and formed on a connection region of each said lower layer of the upper electrode of the capacitor, a pair of n+-type source/drain electrodes formed on each said channel layer, the source/drain electrodes being separated from each other on said channel protection layer, an upper layer of the upper electrode of the capacitor made of a same material layer as said source/drain electrodes, formed on each said lower layer of the upper electrode of the capacitor, and covering said capacitor protection layer, a second insulating layer formed on said first insulating layer and covering said source/drain electrodes and said upper layers of the upper electrode of the capacitor, a first connection hole penetrating said second insulating layer and exposing each one of said pair of the source/drain electrodes, a second connection hole penetrating said second insulating layer and exposing a connection region of each of said upper layers of the upper electrode of the capacitor, and a pixel electrode formed on said second insulating layer and connected to each one of said source/drain electrodes and said upper layer of the upper electrode of the capacitor via said first connection hole and said second connection hole.

According to another aspect of the present invention, there is provided a thin-film transistor substrate comprising a substrate having an insulating surface, gate electrodes made of a conductive material layer formed on said substrate, lower electrodes of capacitors made of a same material layer as said gate electrode and formed on said substrate, a first insulating layer formed on said substrate and covering said gate electrodes and said lower electrodes of the capacitors, a channel layer of high resistivity semiconductor having a concave part on a surface above each of said gate electrodes and formed on said first insulating layer over each of said gate electrodes, a lower layer of an upper electrode of the capacitor having no concave part on a surface, made of a same material layer as said channel layer, and formed on said first insulating layer above each of said lower electrodes of the capacitors, a pair of low resistivity source/drain electrodes formed on regions on both sides of each of said concave parts of said channel layers, an upper layer of the upper electrode of the capacitor made of a same material layer as said source/drain electrodes and formed on said lower layer of each of the upper electrodes of the capacitors, a second insulating layer formed on said first insulating layer and covering said source/drain electrodes and said upper layer of the upper electrode of the capacitor, a first connection hole penetrating said second insulating layer and exposing one of each of said pair of the source/drain electrodes, a second connection hole penetrating said second insulating layer and exposing a connection region of each of said upper layers of the upper electrode of the capacitor; and a pixel electrode formed on said second insulating layer and connected to said one of the source/drain electrodes and said upper layer of the upper electrode of the capacitor via said first connection hole and said second connection hole.

According to further aspect of the present invention, there is provided a liquid crystal display comprising the above-described thin-film transistor substrate, a color filter substrate wherein a color filter and a transparent common electrode are formed on a transparent substrate, and a liquid crystal layer held between said thin-film transistor substrate and said color filter substrate.

The short-circuiting between the electrodes of the additional storage capacitor can be prevented while obtaining a large valid area of the pixel electrode. A new structure of the thin film transistor and the liquid crystal display device are given.

BRIEF DESCRIPTION OF THE DRAWINGS

FIGS. 1A–1D are a plan view and cross-sectional views showing a thin film transistor substrate according to an embodiment of this invention.

FIGS. 2A–2C are an equivalent circuit diagram of the thin film transistor substrate and cross-sectional views of a modified example of the embodiment shown in FIGS. 1A–1D.

FIG. 3 is a cross-sectional view showing the liquid crystal display.

DETAILED DESCRIPTION OF THE PREFERRED EMBODIMENTS

Figure 4:
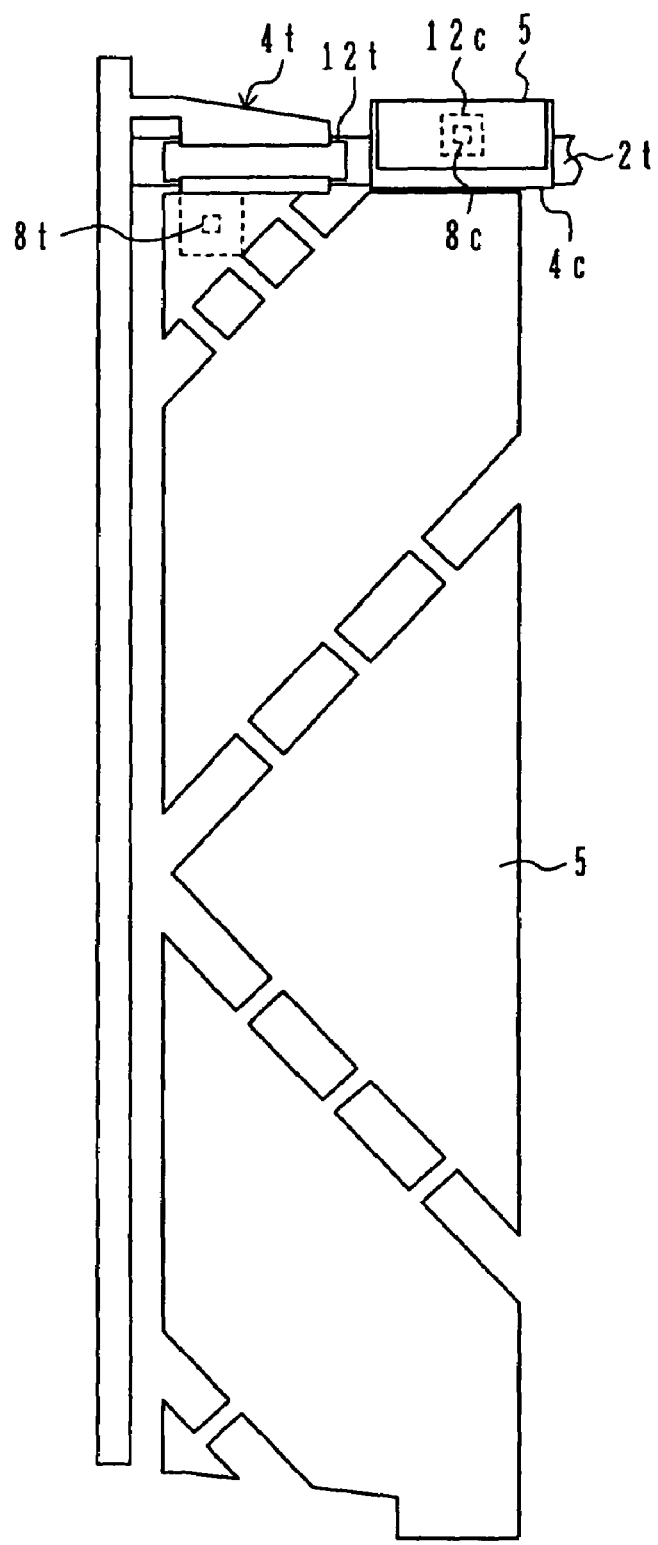
FIG. 4 is a plane view showing a structure of a thin film transistor substrate according to another embodiment of this invention.
Figure 5A:
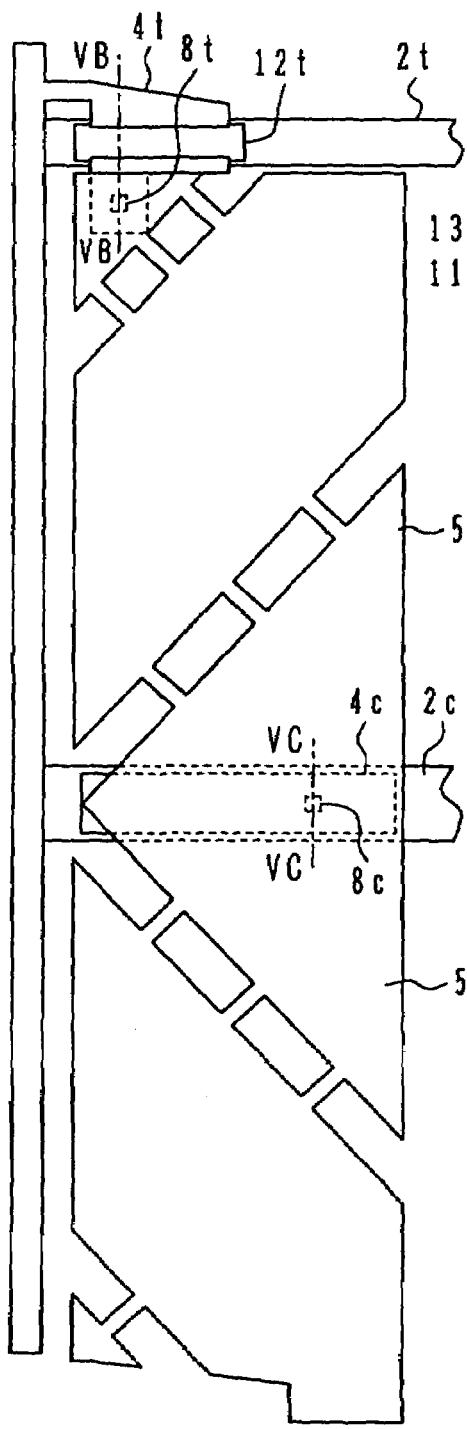
FIGS. 5A–5D are a plan view and cross sectional views for explaining a structure of a thin film transistor substrate according to the prior art.
Figure 5B:
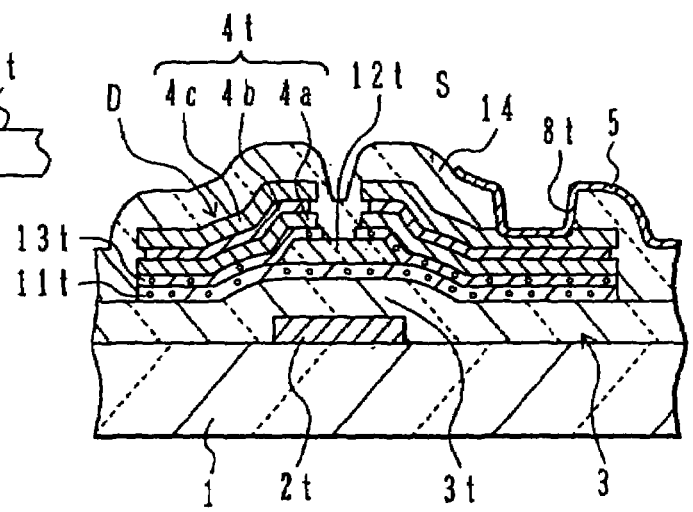
Figure 5C:
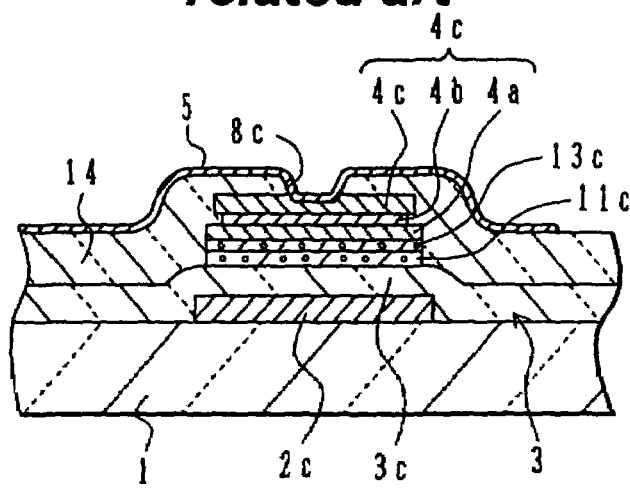
Figure 5D:
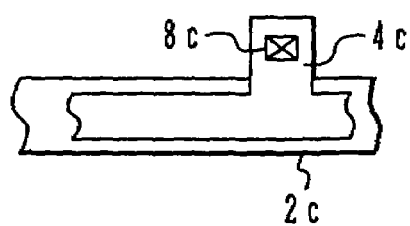

FIGS. 1A–1D are a plan view and cross-sectional views showing a structure of a thin film transistor (TFT) substrate according to an embodiment of this invention. FIG. 1B is a cross sectional view showing the thin film transistor region along a line IB—IB in FIG. 1A, and FIG. 1C is a cross sectional view showing an additional or auxiliary storage capacitor region along a line IC—IC in FIG. 1A.

A gate bus line $2t$ and an additional storage capacitor bus line $2c$ are formed on the glass substrate 1 by depositing an electrode layer, for example by sputtering a layer, and patterning the layer by photolithography. A transparent substrate is used for a transparent liquid crystal display. An opaque substrate other than a transparent substrate can be used for a reflective liquid crystal display, although the surface should be insulated. A substrate having an insulating surface, for example a silicon substrate with an oxide film, a metal plate having an insulating layer on the surface, etc. can be used.

As shown in FIG. 1D, this electrode layer is preferably formed by laminating, for example, an Al layer 2-1 with a thickness of about 10 nm for the lower layer and a Ti layer 2-2 with a thickness of about 50 nm for the upper layer.

After patterning the electrode layer, an insulating layer 3 made of, for example, a $Si_3N_4$3 layer with a thickness of 400 nm is deposited by, for example, CVD. This insulating film 3 forms a gate insulating layer $3t$ in the thin film transistor region and a dielectric film of a capacitor $3c$ in the additional storage capacitor.

For example, a high resistivity amorphous silicon layer with a thickness of 30 nm that can form a thin film transistor channel $11t$, $11c$ is deposited on the insulating layer 3 by, for example, CVD. On the high resistivity amorphous silicon layer, for example, a $Si_3N_4$3 layer with a thickness of about 150 nm as an etching stopper layer is deposited by CVD. The $Si_3N_4$3 layer is patterned by photolithography and etching to remain a channel protection layer $12t$ in the thin film transistor region and to remain a capacitor protection layer $12c$ in the additional storage capacitor region.

On the high resistivity amorphous silicon layer, for example, an n+ type (low resistivity) amorphous silicon layer with a thickness of 30 nm is deposited by CVD while covering those insulating layers $12t$ and $12c$. Thereon, for example, a Ti layer $4a$ with a thickness of about 20 nm, Al layer $4b$ with a thickness of about 75 nm and Ti layer $4c$ with a thickness of about 40 nm are deposited sequentially by sputtering.

Then a resist pattern is formed on the Ti layer $4c$, for example, Ti layer $4c$, Al layer $4b$ and Ti layer $4a$ are etched by reactive ion etching (RIE) using Cl-cintaining etching gas, further an n+ type amorphous silicon layer and a high resistivity amorphous silicon layer are etched into, respectively. 13t/13c and 11t/11c.

The channel protection layer 12t works as an etching stopper and protects a high resistivity silicon layer 11t underneath. At the both sides of channel protection layers 12t, an n+ type silicon layer 13t contacts the high resistivity silicon layer 11t. As described above, a pair of source/drain electrodes S and D is formed in separated regions on the channel layer 11t.

Also, in the additional storage capacitor region, a capacitor protection layer 12c is remained only in a limited region, and around that region, an n+ type silicon layer 13c contacts with the high resistivity silicon layer 11c underneath. The high resistivity silicon layer 11c, the n+ type silicon layer 13c, and the metal electrodes 4a, 4b and 4c form an upper electrode of the capacitor.

Then while covering the source/drain electrodes S, D and the upper electrodes, an upper protection layer 14 of the $Si_3N_4$ layer, for example, with a thickness of about 300 nm is deposited by CVD. The upper protection layer 14 may be formed of an organic insulating layer, etc., other than the $Si_3N_4$ layer. A resist pattern is formed on the $Si_3N_4$ layer 14, and etching is performed to open a connection hole on the source electrode S and the upper electrode. At this time, the drain electrode D is covered with the resist pattern.

This etching is performed by RIE using F-containing dry etchant, for example, $CF_4$, $CHF_3$, $SF_6$ or the like. Even if a pinhole exists at the upper electrode 4c of the capacitor, the surface of the lower electrode 2c is not exposed unless the high resistivity silicon layer 11c and the $Si_3N_4$ layer 3c are etched. Therefore, an opening 8c is formed while preventing a short circuit between the lower electrode and the upper electrode.

Further, in the source electrode S of the thin film transistor, an opening 8t is also formed. In the source electrode S, even if a pinhole exists, only a part of the source electrode S is etched, therefore the function is not affected very much.

After forming the opening at the $Si_3N_4$ layer 14, the ITO layer is deposited thereon, and patterned by etching to form a transparent pixel electrode 5. The upper electrode of the capacitor is connected to the source electrode S via the transparent pixel electrode 5, and when a drive voltage is given to the pixel electrode via the drain electrode D and the source electrode S, the voltage can be stored in the capacitor.

Although description has been made on the case wherein the thin film transistor is formed by using the amorphous silicon layer, the amorphous silicon layer may be converted to a polycrystalline silicon layer by annealing with a XeCl laser after depositing the amorphous silicon layer. The polycrystalline silicon layer can improve the performance of the thin film transistor.

FIG. 2A shows an equivalent circuit diagram of a circuit formed on the thin film transistor substrate. A plurality of drain bus lines DB are formed in vertical direction. A plurality of gate bus lines GB and additional storage capacitor bus lines CSB are formed in horizontal direction.

A thin film transistor TR is connected to each cross point of the drain bus line DB and the gate bus line GB. A drain electrode D of the thin film transistor TR is connected to the drain bus line DB, an insulated gate electrode is connected to the gate bus line GB, and a source electrode S is connected with a transparent pixel electrode PX.

A capacitor C is connected between each of the transparent pixel electrodes PX and an additional storage capacitor bus line CSB. The additional storage capacitor bus line CSB is maintained at a constant voltage, for example, a ground voltage, and the capacitor C stores an image signal voltage supplied via the drain electrode D from the drain bus line DB. Although the figure shows the structure of two rows and two columns, more rows and columns are formed in actual thin film transistor substrates.

Although description has been made on the structure wherein an etching stopper is formed on the channel layer, the etching stopper can be omitted by making the channel layer thick.

FIGS. 2B and 2C show structures using a channel etch-type thin film transistor. Similar reference symbols are given to similar elements as in FIG. 1 and detailed explanations will be simplified.

After an insulating layer 3 forming a gate insulating layer 3t and a dielectric layer of a capacitor 3c is deposited, a high resistivity amorphous silicon layer 11 that can form a channel is deposited, and thereon an n+-type amorphous silicon layer 13 highly doped with n-type impurity is deposited. Then, a resist pattern is formed on the n+-type amorphous silicon layer 13, and the n+-type amorphous silicon layer 13 and the n-type amorphous silicon layer 11 are patterned by etching to remain the silicon layers 13t, 11t, 13c and 11c only in the thin film transistor region and the additional storage capacitor region.

Then, a metal electrode 4 is deposited, and source/drain electrodes 4t and an upper metal electrode of the capacitor 4c are patterned by etching. In this etching, although the n+-type amorphous silicon layer 13t is etched, part of the thickness of the high resistivity amorphous silicon layer 11t underneath remains by controlling the etching amount after etching the metal electrode layer. In the additional storage capacitor region, the amorphous silicon layers 13c and 11c are completely covered by the metal electrode 4c.

Thereafter, similar to the above-described embodiment, a $Si_3N_4$ layer 14 is deposited, and connection holes 8t and 8c penetrating the $Si_3N_4$ layer 14 are formed by etching. After opening the connection holes 8t and 8c, a transparent pixel electrode 5 is deposited and patterned.

When the connection holes 8t and 8c are etched on the $Si_3N_4$ layer, even if a pinhole exists in the metal electrode layer, etching is done to the silicon layers 13c and 11c underneath at first, then to the $Si_3N_4$ layer 3c. Therefore the etching can be stopped before exposing the lower electrode 2c, and the short circuit between the upper electrode and the lower electrode can be prevented.

FIG. 3 shows a state when a liquid crystal display is formed by using the above-described thin film transistor substrate and a well-known color filter substrate. Pixel electrodes PX are formed on the surface of the thin film transistor substrate TRS.

On the surface of the opposing color filter substrate CFS, for example red, green and blue color filters CF are formed, and a transparent common electrode CT made of ITO and being common to a whole display region is formed on the color filters CF. Further, insulating protrusions VA are formed in limited regions. In the part where the protrusion VA exists, a distribution of electric force lines is adjusted.

In the state when a voltage is not applied between the electrodes, liquid crystal molecules of a liquid crystal layer are orientated vertical to the surface of the substrate. When a voltage is applied between the electrodes, the liquid crystal molecules in the liquid crystal layer LC are modulated the orientation to be arranged vertical to the electric force lines. On the protrusions VA, the orientation of the liquid crystal molecules is inclined when the voltage is not applied. Therefore direction of collapse of the liquid crystal molecules is controlled when a voltage is applied. Therefore, a multi-vertical alignment (MVA) liquid crystal display which has plural areas of different orientation is formed.

The additional storage capacitor is not limited to the case where the additional storage capacitor bus line is formed separately from the gate bus line. Also, the additional storage capacitor can be formed by using the gate bus line.

FIG. 4 shows an example of the structure that forms the additional storage capacitor on the gate bus line. A gate bus line 2t contains a region for forming a thin film transistor, and also a region for forming an additional storage capacitor. After a gate insulating layer is formed on the gate bus line, a high resistivity amorphous silicon layer forming the channel and a $Si_3N_4$ layer as an etching stopper are deposited. The $Si_3N_4$ layer is selectively etched to remain a channel protecting film 12t in the thin film transistor region on the gate bus line and to remain the capacitor protecting film 12c in the additional storage capacitor region.

By depositing an $n^+$-type amorphous silicon layer that forms the source/drain electrodes and an upper electrode and a metal electrode layer and by patterning them, source/drain electrodes 4t are formed in the thin film transistor region, and an upper electrode 4c is also formed in the additional storage capacitor region. Then, the thin film transistor substrate is formed by the steps similar to the above-described embodiment.

The upper electrode 4c is connected to the transparent pixel electrode 5 of the upper side in the figure via the connection hole 8c. By this structure, the voltage applied to the upper electrode of the additional storage capacitor is the voltage at the next pixel, and the gate bus line 2t is maintained at the constant voltage at that time. Therefore, an electric charge is effectively stored in the additional storage capacitor.

Although description has been made on the case where the gate bus line and the lower electrode of the additional storage capacitor are formed of Al/Ti lamination, the gate bus line may be formed of other conductive. For example, a Cr single layer and an Al/Mo lamination can be used.

Although description has been made on the case where the gate insulating film, the etching stopper layer and the upper insulating protecting film are formed of silicon nitride layers, other insulating layers can be used. For example, silicon oxide layers and silicon oxide nitride layers can be used. Also the combination of a plural types of insulating layers can be used.

Although description has been made on the case when the metal electrodes of the source/drain electrodes are formed of a Ti/Al/Ti lamination, other conductive layers may be used. For example, a Cr single layer and a Mo/Al/Mo lamination may be used.

The present invention has been described in connection with the preferred embodiments. The invention is not limited only to the above embodiments. It will be apparent for those skilled in the art that various modifications, improvements, combinations, and the like can be made.

What are claimed are:

1. A thin-film transistor substrate, comprising:
   a substrate having an insulating surface;
   gate electrodes made of a conductive material layer formed on said substrate;
   lower electrodes of capacitors made of a same material layer as said gate electrodes and formed on said substrate;
   a first insulating layer formed on said substrate and covering said gate electrodes and said lower electrodes of the capacitors;
   a channel layer of high resistivity semiconductor having a concave part of a reduced thickness on a surface above each of said gate electrodes and formed on said first insulating layer over each of said gate electrodes;
   a lower layer of an upper electrode of the capacitor having no concave part on a surface, made of a same material layer as said channel layer, and formed on said first insulating layer above each of said lower electrodes of the capacitors, with said lower layer of the upper electrode being patterned to be located in a connection region;
   a pair of low resistivity source/drain electrodes formed on regions on both sides of each of said concave parts of said channel layers;
   an upper layer of the upper electrode of the capacitor made of a same material layer as said source/drain electrodes and formed to envelope said lower layer of each of the upper electrodes of the capacitors;
   a second insulating layer formed on said first insulating layer and covering said source/drain electrodes and said upper layer of the upper electrode of the capacitor;
   a first connection hole penetrating said second insulating layer and exposing one of each of said pair of the source/drain electrodes;
   a second connection hole penetrating said second insulating layer and exposing a connection region of each of said upper layers of the upper electrode of the capacitor above said lower layer; and
   a pixel electrode formed on said second insulating layer and connected to said one of the source/drain electrodes and said upper layer of the upper electrode of the capacitor via said first connection hole and said second connection hole.

2. The thin-film transistor substrate according to claim 1, wherein each of said gate electrodes and each of said lower electrodes of the capacitors are made of parts of an electrically isolated bus line formed on said substrate.

3. The thin-film transistor substrate according to claim 1, wherein said gate electrode and said lower electrode of the capacitor are made of different parts of a gate bus line formed on said substrate.

4. The thin-film transistor substrate according to claim 1, wherein
   said lower layer of the upper electrode of the capacitor is made of a high resistivity amorphous silicon layer, and
   said source/drain electrodes and said upper layer of the upper electrode of the capacitor comprise a doped amorphous silicon layer formed on said high resistivity amorphous silicon layer.

5. The thin-film transistor substrate according to claim 1, wherein said lower layer of the upper electrode of the capacitor is located within a region above an associated one of said lower electrodes of the capacitor.

6. The thin-film transistor substrate according to claim 5, wherein said upper layer of the upper electrode covers the lower layer of the upper electrode.

7. The thin-film transistor substrate according to claim 5, wherein said second connection hole is located within a region above said lower layer of the upper electrode.

8. The thin film substrate according to claim 1, wherein said channel layer of high resistivity semiconductor is of a substantially uniform thickness except for an area of said reduced thickness.

* * * * *